(12) United States Patent
Feng et al.

(10) Patent No.: US 9,842,760 B1
(45) Date of Patent: Dec. 12, 2017

(54) METHOD FOR FABRICATING SEMICONDUCTOR DEVICE

(71) Applicant: UNITED MICROELECTRONICS CORP., Hsin-Chu (TW)

(72) Inventors: Li-Wei Feng, Kaohsiung (TW); Tong-Jyun Huang, Tainan (TW); Shih-Hung Tsai, Tainan (TW); Jyh-Shyang Jenq, Pingtung County (TW); Chun-Yao Yang, Kaohsiung (TW); Ming-Shiou Hsieh, Chiayi County (TW); Rong-Sin Lin, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/215,554

(22) Filed: Jul. 20, 2016

(51) Int. Cl.
| | |
|---|---|
| *H01L 21/324* | (2006.01) |
| *H01L 21/762* | (2006.01) |
| *H01L 29/66* | (2006.01) |
| *H01L 29/06* | (2006.01) |
| *H01L 29/78* | (2006.01) |
| *H01L 21/265* | (2006.01) |

(52) U.S. Cl.
CPC .. *H01L 21/76237* (2013.01); *H01L 21/26513* (2013.01); *H01L 21/324* (2013.01); *H01L 29/0638* (2013.01); *H01L 29/0653* (2013.01); *H01L 29/66537* (2013.01); *H01L 29/66795* (2013.01); *H01L 29/7851* (2013.01)

(58) Field of Classification Search
CPC ......... H01L 21/76237; H01L 29/66795; H01L 29/66537; H01L 29/7851; H01L 21/26513; H01L 21/324; H01L 29/0638; H01L 29/0653; H01L 29/785; H01L 27/0924; H01L 27/0886; H01L 21/845; H01L 21/823821; H01L 21/823431; H01L 27/1211; H01L 27/10826; H01L 27/10879; H01L 29/41791; H01L 29/7856; H01L 29/66818; H01L 2924/13067

See application file for complete search history.

(56) References Cited

U.S. PATENT DOCUMENTS

2015/0044829 A1* 2/2015 Kim .................. H01L 21/82380
                                                            438/199

* cited by examiner

*Primary Examiner* — Thanh T Nguyen
(74) *Attorney, Agent, or Firm* — Winston Hsu

(57) ABSTRACT

A method for fabricating semiconductor device is disclosed. First, a substrate having a fin-shaped structure thereon is provided, a spacer is formed adjacent to the fin-shaped structure, and the spacer is used as mask to remove part of the substrate for forming an isolation trench, in which the isolation trench includes two sidewall portions and a bottom portion. Next, a plasma doping process is conducted to implant dopants into the two sidewall portions and the bottom portion of the isolation trench.

15 Claims, 6 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of using plasma doping process to implant dopants into bottom portion of a fin-shaped structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to a preferred embodiment of the present invention, a method for fabricating semiconductor device is disclosed. First, a substrate having a fin-shaped structure thereon is provided, a spacer is formed adjacent to the fin-shaped structure, and the spacer is used as mask to remove part of the substrate for forming an isolation trench, in which the isolation trench includes two sidewall portions and a bottom portion. Next, a plasma doping process is conducted to implant dopants into the two sidewall portions and the bottom portion of the isolation trench.

According to another aspect of the present invention, a method for fabricating semiconductor device is disclosed. First, a substrate having a fin-shaped structure thereon is provided, a spacer is formed adjacent to the fin-shaped structure, and the spacer is used as mask to remove part of the substrate for forming an isolation trench, in which the isolation trench includes two sidewall portions and a bottom portion. Next, a liner is formed on the two sidewalls portion and the bottom portion, a plasma doping process is performed to implant dopants into the liner, and the dopants are driven from the liner into the bottom portion of the isolation trench.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
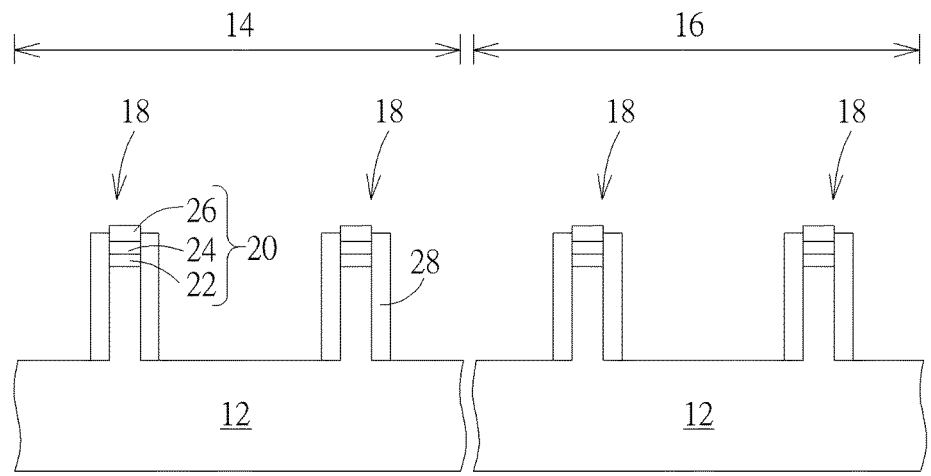
FIGS. 1-11 illustrate a method for fabricating semiconductor device according to a preferred embodiment of the present invention.

Referring to FIGS. 1-11, FIGS. 1-11 illustrate a method for fabricating semiconductor device according to a preferred embodiment of the present invention. As shown in FIG. 1, a substrate 12, such as a silicon substrate or silicon-on-insulator (SOI) substrate is provided, and a first region and a second region are defined on the substrate. In this embodiment, the first region is preferably a PMOS region 14 while the second region is a NMOS region 16, but not limited thereto.

Next, a plurality of fin-shaped structures 18 is formed on the substrate 12 and a mask layer 20 is formed on each of the fin-shaped structures 18. Preferably, the mask layer 20 could be a single-layered structure or a multi-layered structure, in which the mask layer 20 is selected from the material consisting of $SiO_2$, SiN, SiON, and SiCN. In this embodiment, the mask layer 20 is preferably a multi-layered structure composed of a silicon oxide layer 22, a silicon nitride layer 24, and another silicon oxide layer 26, but not limited thereto. It should also be noted that even though two fin-shaped structures 18 are formed on each of the PMOS region 14 and NMOS region 16, the quantity of the fin-shaped structures 18 could be adjusted according to the demand of the product.

According to an embodiment of the present invention, the fin-shaped structures 18 are obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 could also be obtained by first forming a patterned mask (not shown) on the substrate 12, and through an etching process, the pattern of the patterned mask is transferred to the substrate 12 to form the fin-shaped structure 18. Moreover, the formation of the fin-shaped structures 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18. These approaches for forming fin-shaped structures are all within the scope of the present invention.

Next, a spacer 28 is formed adjacent to each of the fin-shaped structures 18. In this embodiment, the formation of the spacer 28 could be accomplished by first depositing a cap layer (not shown) on the substrate 12 to cover the fin-shaped structures 18 and mask layers 20, and an etching back process is conducted to remove part of the cap layer for forming the spacer 28 adjacent to each of the fin-shaped structures 18.

Figure 2:
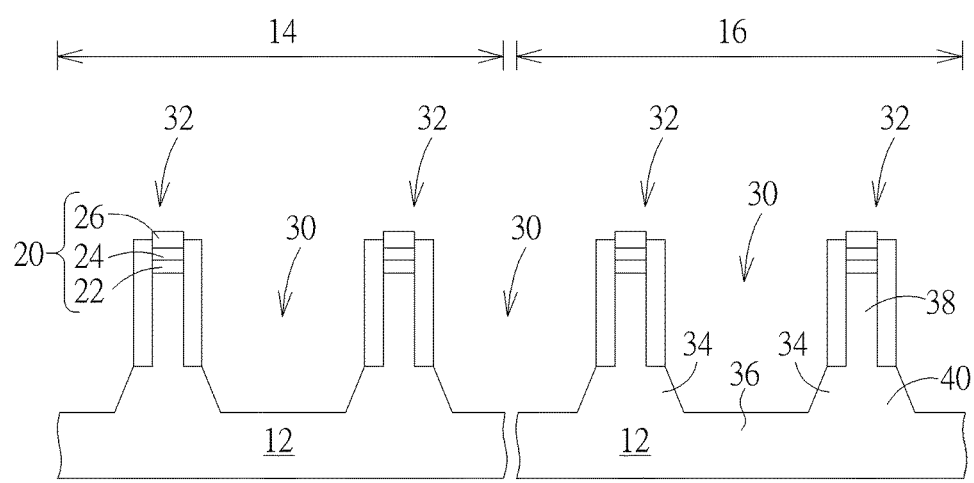

Next, as shown in FIG. 2, an etching process is conducted by using the mask layers 20 and spacers 28 as mask to remove part of the substrate 12 for forming isolation trenches 30 and newly formed fin-shaped structures 32. Preferably, each of the isolation trenches 30 includes two sidewall portions 34 and a bottom portion 36 while each of the newly formed fin-shaped structures 32 includes a top portion 38 and a bottom portion 40. It should be noted that even though the sidewall portions 34 include inclined sidewalls adjacent to two sides of the top portion 34 or bottom portion 36 in this embodiment, it would also be desirable to adjust the parameter of the aforementioned etching process to form bottom portions 40 of the fin-shaped structures 32 or sidewall portions 34 of the isolation trenches 30 with completely straight and vertical sidewalls, and in such instance, a right angle would be included between the sidewall portions 34 and the surface of the substrate 12.

Specifically, each spacer 28 is preferably disposed around the top portion 38 of each fin-shaped structure 32 while the bottom portion 40 is exposed completely. In this embodiment, the height between the top surface of the mask layer 20 to the bottom surface of the top portion 38 is approximately between 300 Angstroms to 700 Angstroms, or more preferably about 500 Angstroms, and the height between the top surface of the mask layer 20 to the bottom surface of the bottom portion 40 is approximately between 800 Angstroms to 2000 Angstroms, or more preferably about 1300 Angstroms.

Figure 3:
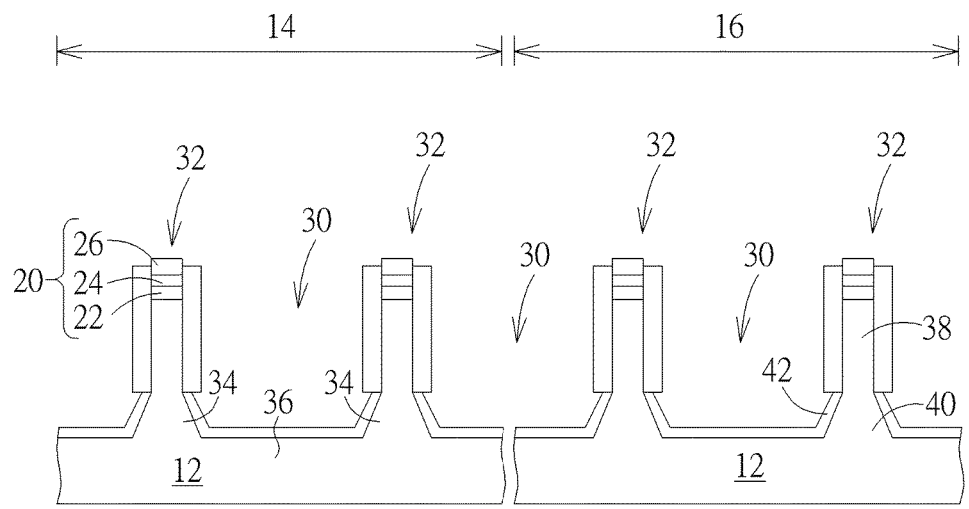

Next, as shown in FIG. 3, a liner 42 is selectively formed on the sidewall portions 34 and the bottom. portions 36 of the isolation trenches 30. Preferably, the liner 42 is grown by an in-situ steam generation (ISSG) process on the substrate 12, in which the liner 42 could be formed by consuming a small portion of the bottom portion 40 of the fin-shaped structures 32 or sidewall portions 34 of the isolation trenches 30. In this embodiment, the liner 42 is composed of silicon dioxide, but not limited thereto.

Figure 4:
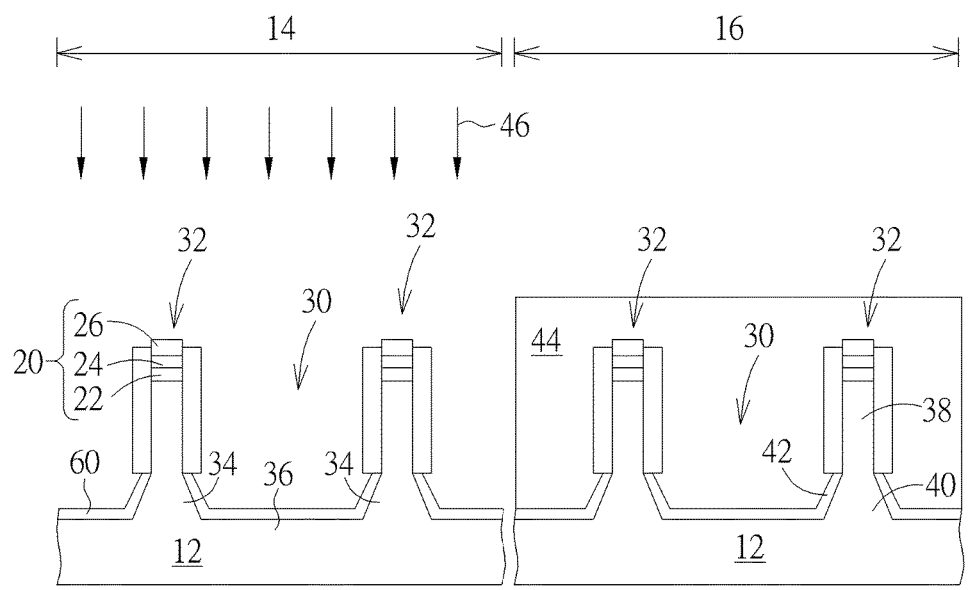

Next, as shown in FIG. 4, a patterned mask, such as a patterned resist 44 is formed on the NMOS region 16, and a plasma doping process 46 is performed to inject n-type dopants into the liner 42 on the PMOS region 14 to form a doped region 60. It should be noted that since the conventional approach of using ion implantation process typically results in doped regions having uneven thickness, the doped region of the present invention formed by plasma doping process preferably includes an even thickness within the liner 42.

Figure 5:
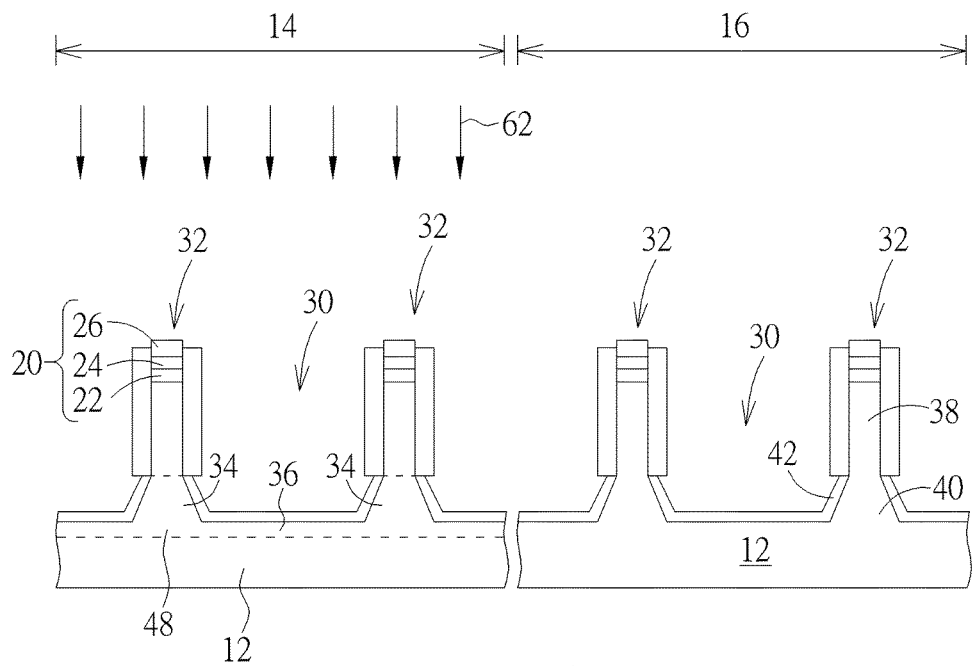

Next, as shown in FIG. 5, an anneal process 62 is conducted to drive-in the n-type dopants for forming an anti-punch-through (APT) region 48, and the patterned resist 44 is stripped thereafter.

According to a preferred embodiment of the present invention, the species of n-type dopants implanted preferably includes $BF_3$ and/or $B_2H_6$, the energy of the plasma doping process 46 is between 1 KeV to 12 KeV and the dosage of the dopants is preferably between 1E13 to 2E14. In addition, the temperature of the anneal process is preferably between 1000° C. to 1100° C., and the duration of the anneal process is between 5 seconds to 60 seconds.

Figure 6:
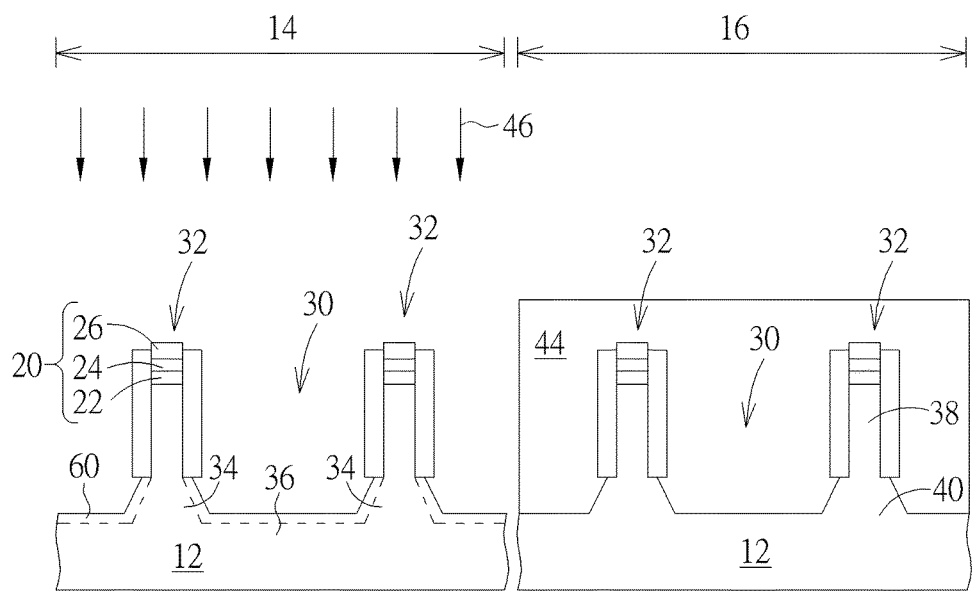
Figure 7:
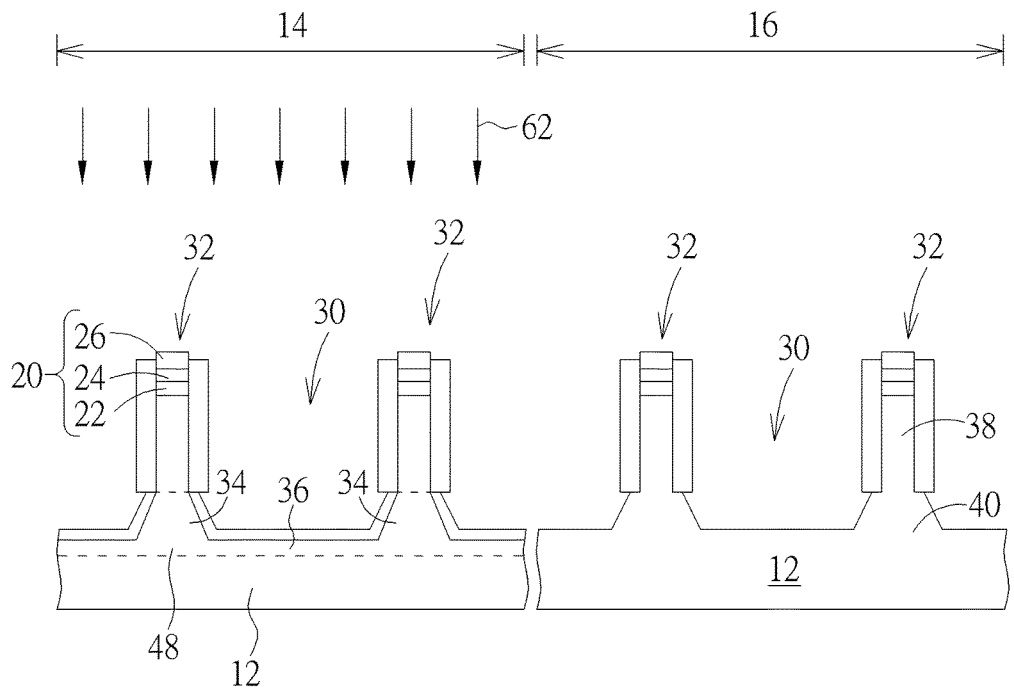

It should be noted that according to an embodiment of the present invention, if no liner 42 were formed on the sidewall portions 34 and the bottom portions 36 of the isolation trenches 30, as shown in FIG. 6, dopants from the plasma doping process 46 would be implanted directly into the sidewall portions 34 and bottom portions 36 of the isolation trenches 30 to form a doped region 60, in which the doped region 60 preferably includes an even thickness. Next, as shown in FIG. 7, an anneal process is conducted to drive-in the dopants for forming an APT region 48.

However, if a liner 42 were formed as disclosed in FIGS. 3-5, it would be desirable to perform the aforementioned plasma doping process 46 to first inject n-type dopants into the liner 42 on the PMOS region 14, and then conduct an anneal process to drive the n-type dopants from the liner 42 into the sidewall portions 34 and bottom portions 36 of the isolation trenches 30 for forming the anti-punch-through (APT) region 48. These two approaches for forming the APT region 48 are all within the scope of the present invention.

Figure 8:
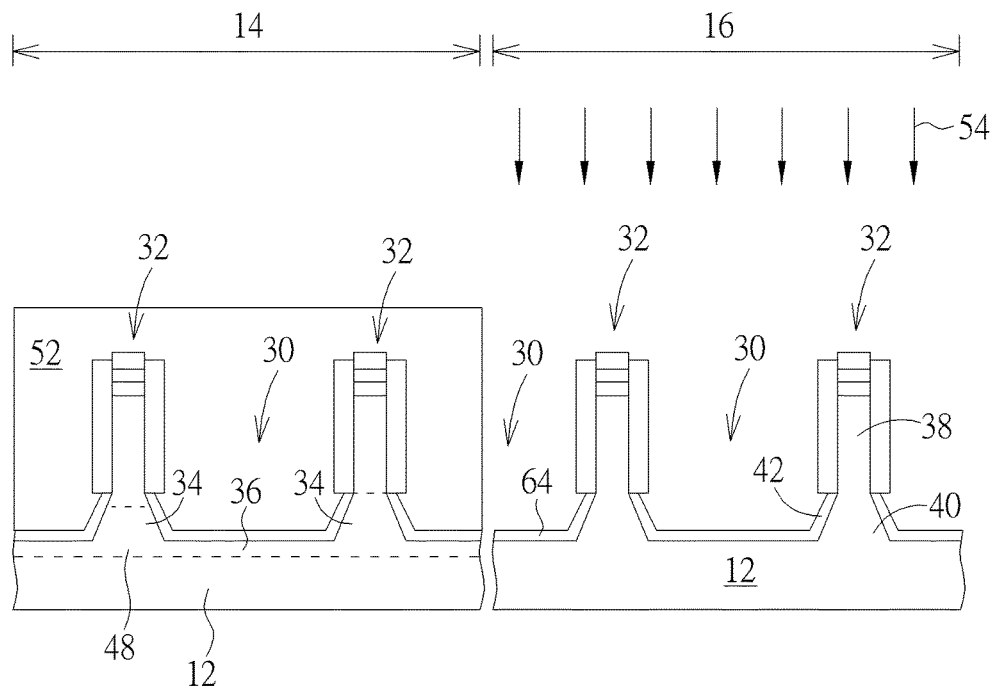

Next, as shown in FIG. 8, another patterned mask, such as a patterned resist 52 is formed on the PMOS region 14, and another plasma doping process 54 is conducted to inject p-type dopants into the liner 42 on the NMOS region 16 for forming a doped region 64. Similarly, the doped region 64 formed by plasma doping process preferably has an even thickness within the liner 42.

Figure 9:
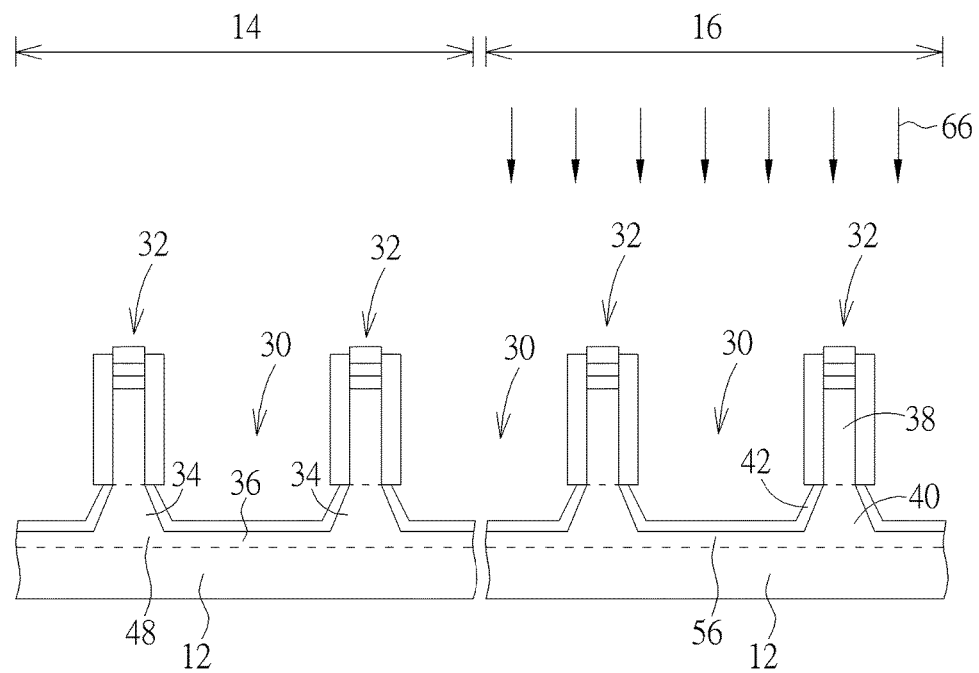

Next, as shown in FIG. 9, an anneal process 66 is conducted to drive-in the p-type dopants for forming an APT region 56, and the patterned resist 52 is stripped thereafter.

Similarly, if no liner 42 were formed as disclosed in the embodiment illustrated in FIGS. 6-7, it would be desirable to perform the aforementioned plasma doping process 54 to first implant p-type dopants directly into the sidewall portions 34 and bottom portions 36 of the isolation trenches 30 to form a doped region (not shown) on the NMOS region 16, in which the doped region preferably has an even thickness, and then conduct an anneal process to drive-in the p-type dopants for forming an APT region.

Figure 10:
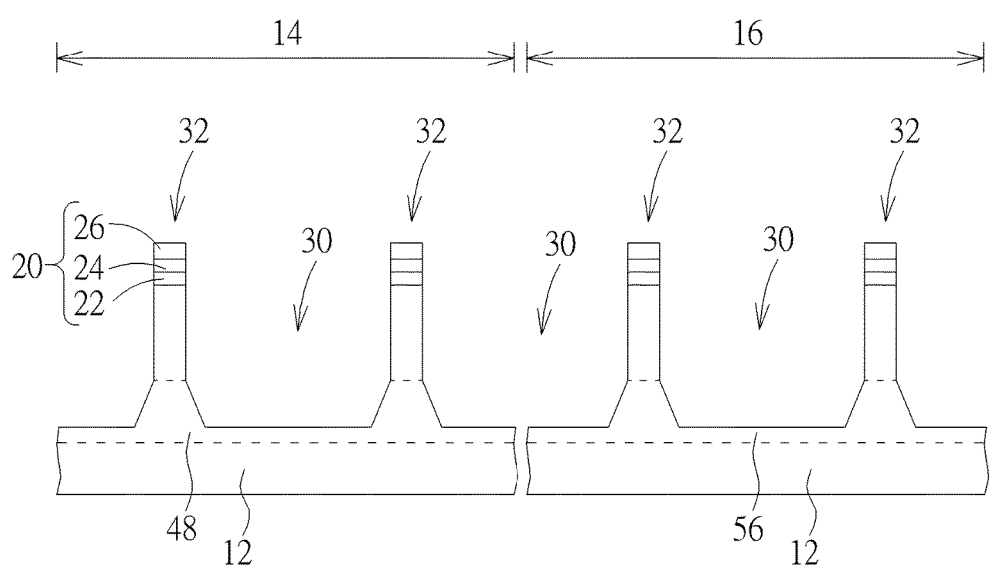

Next, as shown in FIG. 10, an etching process is selected to remove the spacers 38 and expose the fin-shaped structures 32 underneath. It should be noted that the liner 42 could be removed along with the spacers 38 so that the sidewall portions 34 and bottom portions 36 of the trench isolations 30 are also exposed. According to an embodiment of the present invention, whether the liner 42 is removed or not, an additional liner (not shown) made of silicon nitride or silicon oxide could be formed on the liner 42 if not being removed or on the exposed fin-shaped structures 32 directly, which are all within the scope of the present invention.

Figure 11:
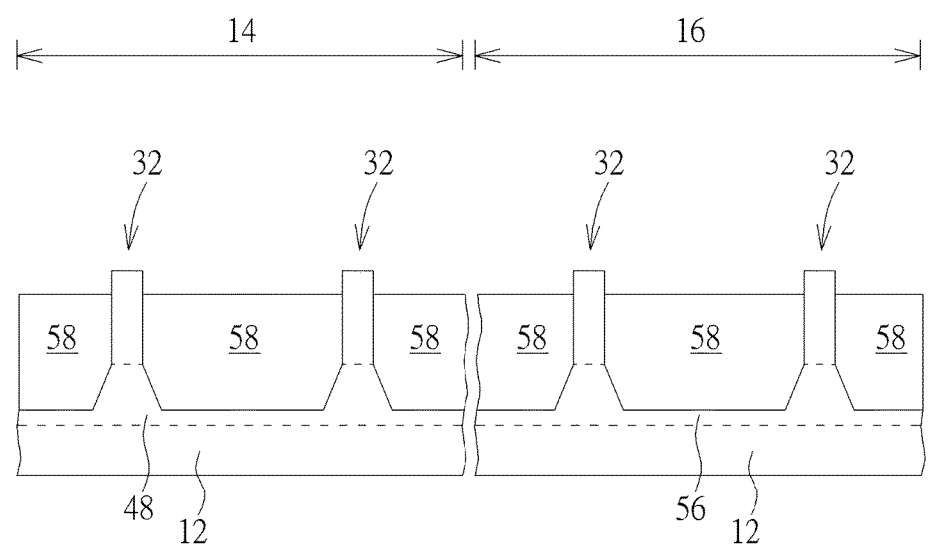

Next, as shown in FIG. 11, an insulating layer (not shown) composed of material such as silicon dioxide is deposited on the substrate 12 to cover the fin-shaped structures 32, and a planarizing process, such as chemical mechanical polishing (CMP) process is conducted to remove part of the insulating layer and the mask layer 20 so that the tip of the fin-shaped structures 32 is even with the top surface of the insulating layer.

Next, part of STI 58 could be removed to form a shallow trench isolation (STI) 58 around the fin-shaped structures 32, an implantation process could be conducted to form well regions (not shown) in the substrate 12, and typical MOS transistor fabrication process could be carried out to form gate structures on the fin-shaped structures, source/drain regions adjacent to two sides of the gate structures, and epitaxial layer and/or silicides on the source/drain regions. After depositing an interlayer dielectric (ILD) layer on the gate structures, a replacement metal gate (RMG) process could be conducted to transform the gate structures into metal gates. Since the formation of the gate structures and the source/drain regions and the RMG process are well known to those skilled in the art, the details of which are not explained herein for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a fin-shaped structure thereon;
   forming a spacer adjacent to the fin-shaped structure;
   using the spacer as mask to remove part of the substrate for forming an isolation trench, wherein the isolation trench comprises two sidewall portions and a bottom portion; and
   performing a plasma doping process to implant dopants into the two sidewall portions and the bottom portion of the isolation trench to form a doped region having an even thickness, wherein a top surface of the doped region contacts a bottom surface of the spacer and the bottom surface of the spacer covers the top surface of the doped region entirely.

2. The method of claim 1, further comprising performing an anneal process to drive-in the dopants after performing the plasma doping process.

3. The method of claim 2, further comprising:
   removing the spacer after performing the anneal process; and
   forming a shallow trench isolation around the fin-shaped structure.

4. The method of claim 1, wherein the spacer comprises silicon nitride.

5. The method of claim 1, wherein the dopants comprise n-type dopants or p-type dopants.

6. The method of claim 1, further comprising performing the plasma doping process to form an isotropic doped region in the bottom portion of the isolation trench.

7. The method of claim 1, further comprising performing the plasma doping process between 1 KeV to 12 KeV.

8. A method for fabricating semiconductor device, comprising:
   providing a substrate having a fin-shaped structure thereon;
   forming a spacer adjacent to the fin-shaped structure;
   using the spacer as mask to remove part of the substrate for forming an isolation trench, wherein the isolation trench comprises two sidewall portions and a bottom portion;
   forming a liner on the two sidewall portions and the bottom portion;
   performing a plasma doping process to implant dopants into the liner; and
   driving the dopants from the liner into the bottom portion of the isolation trench.

9. The method of claim 8, further comprising performing an anneal process to drive-in the dopants after performing the plasma doping process.

10. The method of claim 9, further comprising:
    removing the spacer after performing the anneal process; and
    forming a shallow trench isolation around the fin-shaped structure.

11. The method of claim 10, further comprising removing the liner while removing the spacer.

12. The method of claim 8, wherein the spacer comprises silicon nitride.

13. The method of claim 8, wherein the liner comprises silicon oxide.

14. The method of claim 8, wherein the dopants comprise n-type dopants or p-type dopants.

15. The method of claim 8, further comprising performing the plasma doping process between 1 KeV to 12 KeV.

* * * * *